United States Patent
Tanaka et al.

(10) Patent No.: US 7,312,848 B2
(45) Date of Patent: Dec. 25, 2007

(54) POSITIONING APPARATUS, EXPOSURE APPARATUS, AND DEVICE MANUFACTURING METHOD

(75) Inventors: Hideo Tanaka, Utsunomiya (JP); Yoshikazu Miyajima, Utsunomiya (JP); Yasuhito Sasaki, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 23 days.

(21) Appl. No.: 11/378,511

(22) Filed: Mar. 17, 2006

(65) Prior Publication Data

US 2006/0209287 A1 Sep. 21, 2006

(30) Foreign Application Priority Data

Mar. 18, 2005 (JP) .............................. 2005-080584
Mar. 16, 2006 (JP) .............................. 2006-072175

(51) Int. Cl.
*G03B 27/42* (2006.01)
*G03B 27/52* (2006.01)

(52) U.S. Cl. .......................................... 355/53; 355/30
(58) Field of Classification Search ................. 355/30, 355/53, 72–76; 310/10, 12; 318/135
See application file for complete search history.

(56) References Cited

U.S. PATENT DOCUMENTS

| 5,413,167 | A  | * | 5/1995  | Hara et al. ..................... 165/86 |
| 6,226,073 | B1 | * | 5/2001  | Emoto .......................... 355/53 |
| 6,509,951 | B2 | * | 1/2003  | Loopstra et al. ............... 355/30 |
| 6,810,298 | B2 | * | 10/2004 | Emoto ......................... 700/121 |
| 6,987,335 | B2 |   | 1/2006  | Korenaga |
| 7,116,396 | B2 | * | 10/2006 | Tsuji et al. .................... 355/30 |

FOREIGN PATENT DOCUMENTS

| JP | 3127525 B  | 5/1993 |
| JP | 3127525    | 11/2000 |
| JP | 2004-254489 | 9/2004 |

* cited by examiner

*Primary Examiner*—Henry Hung Nguyen
(74) *Attorney, Agent, or Firm*—Cowan, Liebowitz & Latman, P.C.

(57) ABSTRACT

This invention discloses an apparatus having a base and a movable body which is driven to move along the base. The apparatus includes a generator configured to generate a driving signal for the movable body, a temperature adjusting mechanism configured to adjust temperature of the base, and a controller configured to control a manipulated variable for the temperature control mechanism based on the generated driving signal.

6 Claims, 12 Drawing Sheets

PROFILE WHEN ONLY FEEDBACK LOOP IS USED

FIG. 4B

PROFILE WHEN FEEDFORWARD SYSTEM IS ALSO USED

POSITIONING APPARATUS, EXPOSURE APPARATUS, AND DEVICE MANUFACTURING METHOD

FIELD OF THE INVENTION

The present invention relates to an apparatus having a base and a movable body which can move along the base, an exposure apparatus, and a device manufacturing method.

BACKGROUND OF THE INVENTION

An exposure apparatus which forms a latent image pattern on a photosensitive agent in the following way is available. That is, the exposure apparatus transfers a pattern of an original such as a reticle onto a photosensitive agent applied to a substrate such as a wafer. Alternatively, the exposure apparatus draws or transfers a pattern onto a photosensitive agent on a substrate by a charged-particle beam such as an electron beam. Such an exposure apparatus incorporates a positioning apparatus to align an original and substrate.

Figure 11:
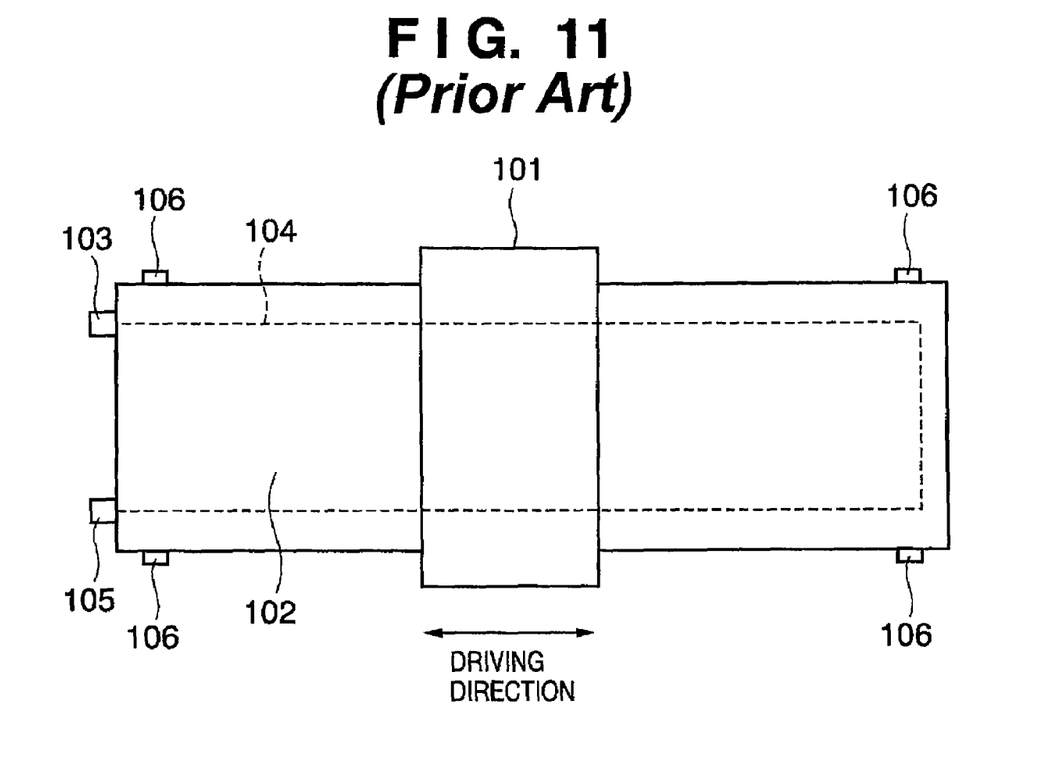
FIG. 11 is a plan view schematically showing an example of a positioning apparatus which drives a movable body in one axial direction.

FIG. 11 is a plan view schematically showing an example of a positioning apparatus which drives a movable body in one axial direction. A stage 101 as the movable body is guided to be smoothly movable on a stage base 102. The stage 101 is driven by an actuator (not shown) and moves on the stage base 102. As a guide technique, for example, a method using a linear guide which generates friction or a method using hydrostatic air, static air, or static pressure bearing to guide the stage in a noncontact manner is available. If a linear guide is used, the maintenance of the apparatus is periodically necessary for keeping the stage positioning accuracy and guide function in a good state. This structure is unsuitable for an exposure apparatus which requires high accuracy and high productivity. If hydrostatic air, static air, or static pressure bearing is used, the stage can be controlled with high accuracy because this structure generates little friction in a noncontact manner.

The guide method using hydrostatic air, static air, or static pressure bearing generally applies pressurizing force (attraction force) between a stage and a stage base which guides the stage, in order to increase the supporting rigidity by raising the air pressure. As the pressurizing technique, a method using a magnet (magnetic force) or a method using a vacuum negative pressure is available. In general, the method using a magnet is more effective in pressurization than the latter method, and can guide the stage with high accuracy. However, when a magnetic field (a pressurizing magnet placed on the stage) moves on a magnetic body having a low insulation resistance, an eddy current is generated. This disturbs stage driving and heats the stage base. In recent years, the moving speed of the stage is increased to improve the throughput, resulting in an increase in heat amount due to the eddy current.

To solve this problem, there has been known an arrangement to remove heat of a stage base due to an eddy current using a refrigerant. In the example shown in FIG. 11, the refrigerant is supplied to a refrigerant path 104 in the stage base 102 through a refrigerant inlet 103. As the refrigerant passes through the refrigerant path 104, it removes heat and is discharged from a refrigerant outlet 105. For temperature control of the refrigerant, temperature sensors 106 arranged at appropriate portions of the stage base 102 can be used. Alternatively, a temperature sensor which directly measures the temperature of the refrigerant can be used. In most cases, a place of the stage base 102, which most requires suppression of temperature rise, is around the center of the stage base 102. However, the temperature sensor cannot be arranged at that place in most cases, so it takes much time to stabilize the temperature of the entire stage base 102. Moreover, a good response characteristic to a change in stage driving profile or a variation in temperature due to the stop and driving of the stage is not obtained.

Figure 12:
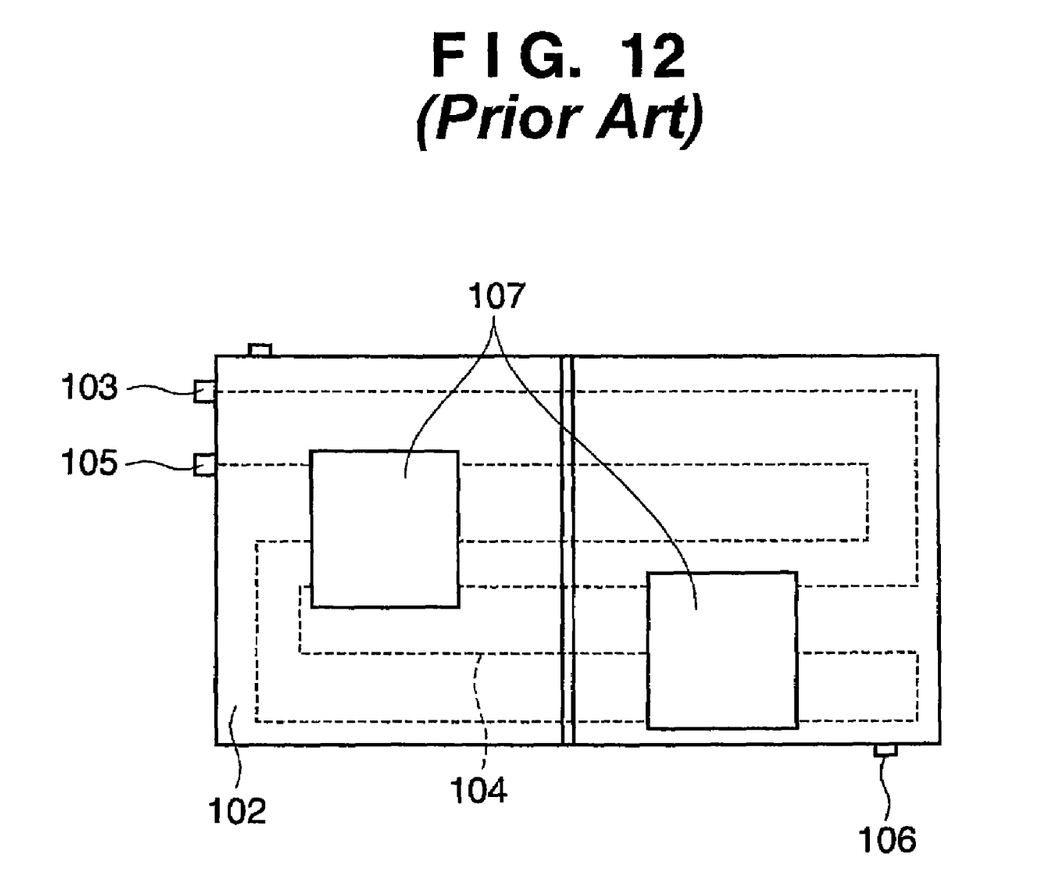
FIG. 12 is a plan view schematically showing the arrangement of a twin-stage type positioning apparatus with a plane motor structure.

FIG. 12 is a plan view schematically showing the arrangement of a twin-stage type positioning apparatus with a plane motor structure. The same reference numerals as in FIG. 11 denote similar constituent elements. This positioning apparatus has two stages which contribute to improvement of the throughput in an exposure process. More specifically, as a alignment measurement process is performed using one of the stages, a wafer having undergone the alignment measurement process is exposed using the other stage.

In general, since the exposure process and the alignment measurement process have different stage driving profiles, they produce different heat amounts due to an eddy current generated in the stage base 102 upon driving the two stages. If such a twin-stage type positioning apparatus has only one cooling system, the temperature distribution may become nonuniform because the heat amount in an exposure process area is different from that in an alignment measurement area. This degrades the measurement accuracy of the stage position. Moreover, the temperature of the wafer varies, resulting in a deterioration in exposure accuracy, particularly, overlay accuracy.

SUMMARY OF THE INVENTION

The present invention has been made in consideration of the above background, and has as its exemplary object to provide a technique for reducing a variation in temperature of a base due to driving a movable body.

According to one aspect of the present invention, there is provided an apparatus including a base and a movable body which is driven to move along the base. The apparatus comprises a generator configured to generate a driving signal for the movable body, a temperature adjusting mechanism configured to adjust temperature of the base, and a controller configured to control a manipulated variable for the temperature control mechanism based on the generated driving signal.

According to a preferred embodiment of the present invention, the temperature control mechanism can be configured to stream coolant through the base, and to control a flow rate of the coolant based on the manipulated variable.

According to a preferred embodiment of the present invention, the temperature control mechanism can be configured to stream coolant through the base, and to control a temperature of the coolant based on the manipulated variable.

According to a preferred embodiment of the present invention, the apparatus can further comprise a temperature sensor configured to measure temperature of the base, wherein the controller is configured to control the manipulated variable further based on measurement performed by the temperature sensor.

According to a preferred embodiment of the present invention, the movable body can include a first movable body and a second movable body that is different from the first movable body, and the temperature control mechanism can include a first temperature control mechanism configured to control temperature of a first area of the base, and a second temperature control mechanism configured to control temperature of a second area, different from the first area, of the base.

According to a preferred embodiment of the present invention, the base is divided into a first base corresponding to the first area and a second base corresponding to the second area.

According to a preferred embodiment of the present invention, the temperature control mechanism can include a heater.

According to a preferred embodiment of the present invention, the movable body can include a magnet and the base can be made of a magnetic material.

According to a preferred embodiment of the present invention, the apparatus can be configured as an exposure apparatus for exposing a substrate to radiation, and the movable body can include a substrate stage configured to hold the substrate.

According to a preferred embodiment of the present invention, the apparatus can be configured as an exposure apparatus for exposing a substrate to radiation via an original plate, and the movable body can include an original plate stage configured to hold the original plate.

According to another aspect of the present invention, there is provided a method of manufacturing a device. The method comprises steps of exposing a substrate to radiation using the above exposure apparatus, developing the exposed substrate, and processing the developed substrate to manufacture the device.

The present invention can provide a technique for reducing a variation in temperature of a base upon driving a movable body.

In accordance with a further aspect of the invention, there is provided an exposure apparatus for exposing a substrate to radiation, the apparatus comprising a base member having a measurement area for measuring the substrate and an exposure area for exposing the substrate; two movable members each configured to hold the substrate and to move on said base member; a first temperature adjusting mechanism configured to adjust temperature of the measurement area; and a second temperature adjusting mechanism configured to adjust temperature of the exposure area, wherein said first temperature adjusting mechanism and said second temperature adjusting mechanism are controlled so as to reduce a temperature difference between the measurement area and the exposure area.

In accordance with another aspect of the invention, there is provided a method of manufacturing a device, the method comprising steps of exposing a substrate to radiation using an exposure apparatus; developing the exposed substrate; and processing the developed substrate to manufacture the device, wherein the exposure apparatus is configured to exposure the substrate to radiation and comprise a base member having a measurement area for measuring the substrate and an exposure area for exposing the substrate; two movable members each configured to hold the substrate and to move on the base member; a first temperature adjusting mechanism configured to adjust temperature of the measurement area; and a second temperature adjusting mechanism configured to adjust temperature of the exposure area, wherein said first temperature adjusting mechanism and said second temperature adjusting mechanism are controlled so as to reduce a temperature difference between the measurement area and the exposure area.

In accordance with vet another aspect of the invention there is provided an exposure apparatus for exposing a substrate to radiation via an original plate, the apparatus comprising a base; an original plate stage configured to hold the original plate and to move on said base; a temperature adjusting mechanism configured to adjust temperature of said base; a profiler configured to provide a driving profile for said original plate stage, the driving profile representing a change, which depends on lapse of time, in a driving velocity of said original plate stage; a controller configured to control said temperature adjusting mechanism based on the driving profile; a base member having a measurement area for measuring the substrate and an exposure area for exposing the substrate; two substrate stages each configured to hold the substrate and to move on said base member; a first temperature adjusting mechanism configured to adjust temperature of the measurement area; and a second temperature adjusting mechanism configured to adjust temperature of the exposure area; wherein said first temperature adjusting mechanism and said second temperature adjusting mechanism are controlled so as to reduce a temperature difference between the measurement area and the exposure area.

In accordance with an additional aspect of the invention, there is provided a method of manufacturing a device, the method comprising steps of exposing a substrate to radiation via an original plate using an exposure apparatus; developing the exposed substrate; and processing the developed substrate to manufacture the device, wherein the exposure apparatus is configured to exposure the substrate to radiation via the original plate and comprise a base; an original plate stage configured to hold the original plate and to move on the base; a temperature adjusting mechanism configured to adjust temperature of the base; a profiler configured to provide a driving profile for the original plate stage, the driving profile representing a change, which depends on lapse of time, in a driving velocity of the original plate stage; a controller configured to control the temperature adjusting mechanism based on the driving profile; a base member having a measurement area for measuring the substrate and an exposure area for exposing the substrate; two substrate stages each configured to hold the substrate and to move on the base member; a first temperature adjusting mechanism configured to adjust temperature of the measurement area; and a second temperature adjusting mechanism configured to adjust temperature of the exposure area, wherein the first temperature adjusting mechanism and the second temperature adjusting mechanism are controlled so as to reduce a temperature difference between the measurement area and the exposure area.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Preferred embodiments of the present invention will be described below.

Figure 1:
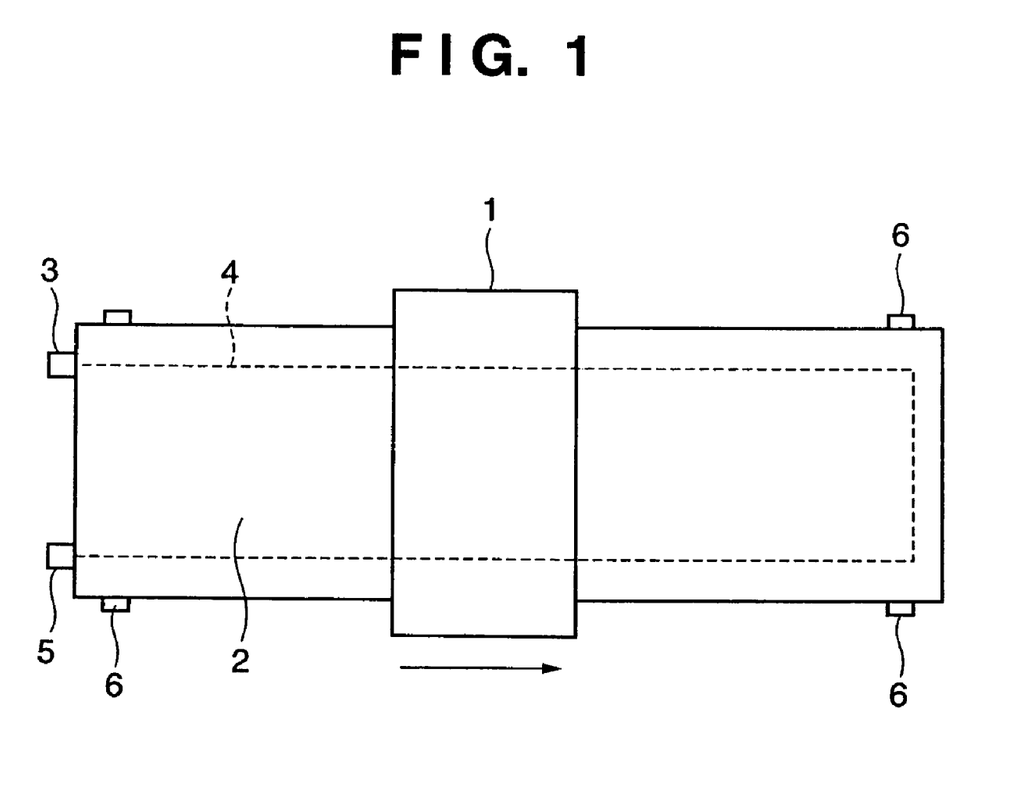
FIG. 1 is a plan view schematically showing the arrangement of a positioning apparatus according to the first embodiment of the present invention.

FIG. 1 is a plan view schematically showing the arrangement of a positioning apparatus according to a preferred embodiment of the present invention. In the positioning apparatus shown in FIG. 1, a stage 1 as a movable body is guided to be smoothly movable on a stage base 2. The stage 1 is driven by an actuator (e.g., a linear motor; not shown) and moves on the stage base 2. The stage 1 is guided by hydrostatic air, static air, or static pressure bearing in a noncontact manner. A pressure is applied between the stage base 2 and the stage 1 by a magnetic force generated by a magnet placed on the stage 1. The stage base 2 has a magnetic plate having a low insulation resistance. When the pressurizing magnet moves on the magnetic plate together with the stage 1, an eddy current is generated in the magnetic plate. This disturbs stage driving and heats up the stage base.

To solve this problem, a temperature controller is provided to control the temperature of the stage base 2 to be constant by removing the heat of the stage base 2. This temperature controller supplies a refrigerant to a refrigerant path 4 in the stage base 2 through a refrigerant inlet 3. As the refrigerant passes through the refrigerant path 4, it removes heat from the stage base 2 and is discharged from a refrigerant outlet 5.

In this embodiment, a temperature sensor 6 measures the temperature of the stage base 2 or the refrigerant which cools it to feed back the measurement result. Simultaneously, a driving profile of the stage 1 is fed forward to control the temperature of the stage base 2.

Figure 2:
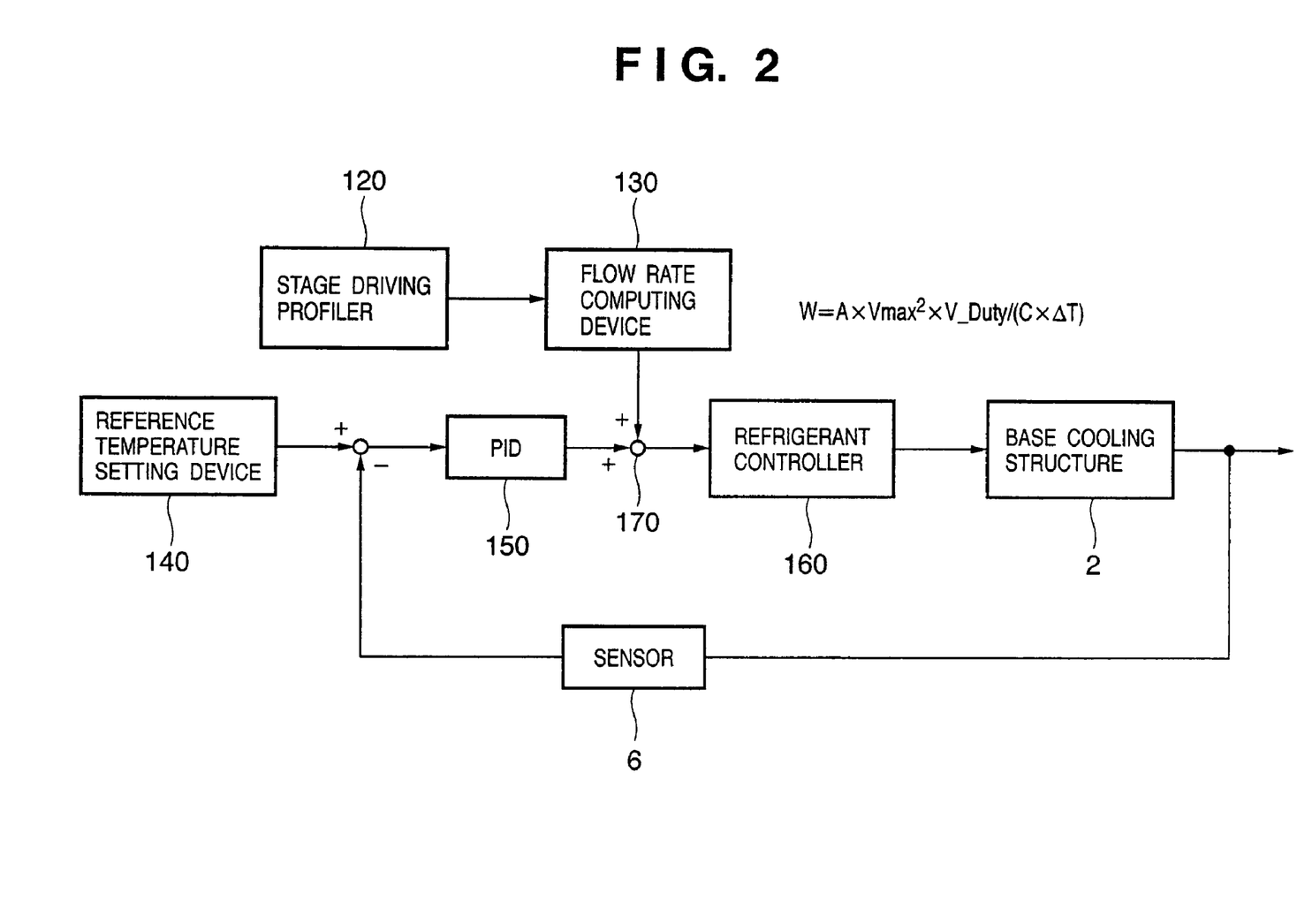
FIG. 2 is a block diagram showing the arrangement of a controller to cool a stage base.

FIG. 2 is a block diagram showing the arrangement of a temperature controller to cool the stage base 2 shown in FIG. 1. A reference temperature setting device 140 gives a reference temperature of the stage base 2. A PID compensator 150 (one element of a controller which controls the manipulated variable of a refrigerant controller 160 to be described later) is notified of the difference (deviation) between a reference temperature given by the reference temperature setting device 140 and a temperature (the temperature of the stage base 2 or a refrigerant which cools it) measured by the temperature sensor 6. The PID compensator 150 calculates the flow rate of a refrigerant on the basis of the input deviation, and sends the obtained result to an adder 170 (one element of the controller).

On the other hand, a stage driving profiler 120 (a generator which generates a driving signal for the stage 1) notifies a flow rate computing device 130 (one element of the controller) of a driving profile (the driving signal for the stage 1) of the stage 1. The flow rate computing device 130 calculates the flow rate of a refrigerant in accordance with equations to be described later, and sends the obtained result to the adder 170.

The adder 170 adds the flow rates of the refrigerants, which are respectively sent from the PID compensator 150 and flow rate computing device 130, and sends the addition result to the refrigerant controller 160 (temperature control mechanism). The refrigerant controller 160 controls, in accordance with the flow rate of the refrigerant, which is sent from the adder 170, the flow rate of a refrigerant to be supplied to the refrigerant inlet 3 provided to the stage base 2.

In this case, the temperature sensor 6, PID compensator 150, adder 170, refrigerant controller 160, and stage base 2 (controlled object) form a feedback loop. Also, the stage driving profiler 120, flow rate computing device 130, adder 170, and stage base 2 (controlled object) form a feedforward system. However, the feedback loop need not necessarily be prepared in consideration of the spirit and scope of the present invention.

Figure 3:
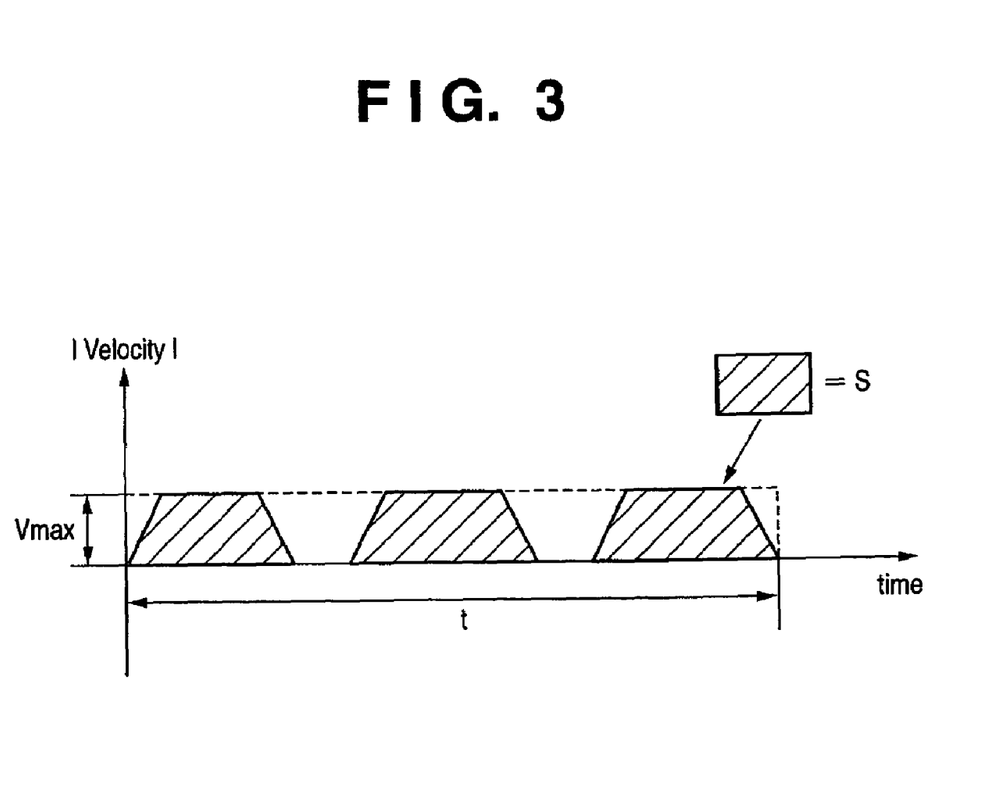
FIG. 3 is a view showing an example of a simplified stage driving profile.

FIG. 3 is a view showing an example of a simplified stage driving profile sent from the stage driving profiler 120. The ordinate represents the absolute value of the driving velocity of the stage 1, and the abscissa represents time. Let S be the value obtained by integrating the absolute value of the driving velocity of the stage 1 over time, and $V_{max}$ be the maximum value of the absolute value of the driving velocity.

The flow rate computing device 130 calculates a mass flow rate W of a refrigerant as follows on the basis of a stage driving profile.

If a stage driving profile is given, a driving duty V_Duty is expressed by:

$$V\_Duty = S/(V_{max} \times t) \quad (1)$$

A calorific value Qv due to an eddy current generated as the stage base 2 moves is expressed by:

$$Qv = A \times V_{max}^2 \times V\_Duty \quad (2)$$

where A is a constant defined by an experiment or analysis.

Letting T1 be the inlet temperature of a cooling target of the refrigerant, T2 be the outlet temperature, and T2−T1=ΔT (K: constant) be the temperature rise, ΔT is a factor which has a great influence on the apparatus accuracy. Since the value of ΔT needs to take a value within the range in which the temperature rise has no influence on the exposure accuracy, it is determined in advance depending on the cooling target. In general, a portion greatly influenced by a temperature variation is set at a temperature sufficiently lower than 1° C.

Letting W (kg/s) be the mass flow rate necessary for cooling the stage base 2, and C (J/kg·K) be the specific heat of the refrigerant, a calorific value Qv is expressed by:

$$Qv = C \times W \times \Delta T \qquad (3)$$

Hence, the mass flow rate W necessary for cooling the stage base 2 is expressed by:

$$W = A \times V_{max}^2 \times V\_Duty/(c \times \Delta T) \qquad (4)$$

The flow rate computing device 130 can thus calculate, in accordance with equation (4), the mass flow rate W of a refrigerant to be supplied to the stage base 2 in correspondence with a stage driving profile.

Figure 4A:
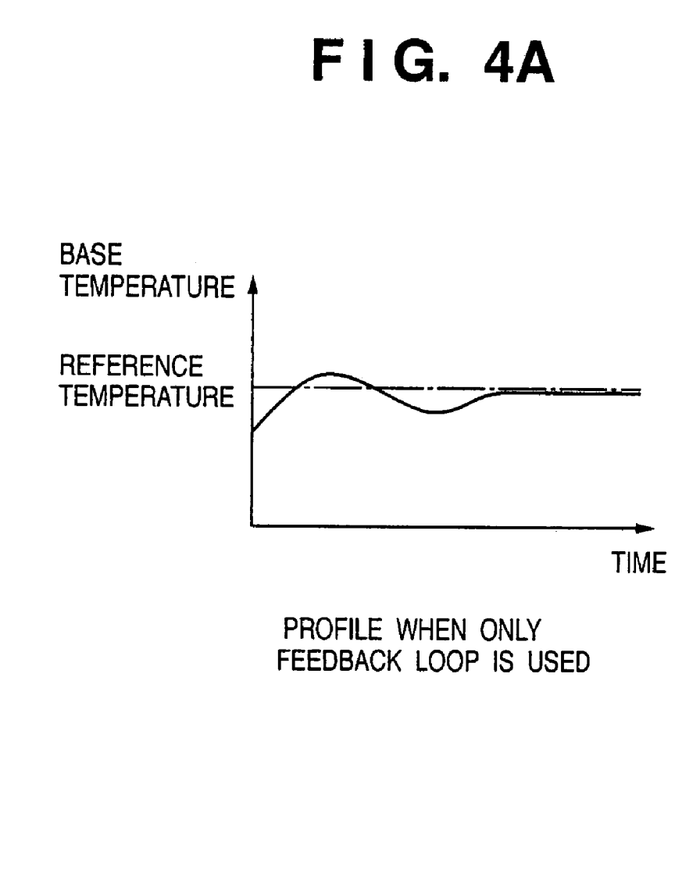
FIG. 4A is a graph showing an example of a temperature change when the temperature of the stage base is controlled by a feedback loop alone.
Figure 4B:
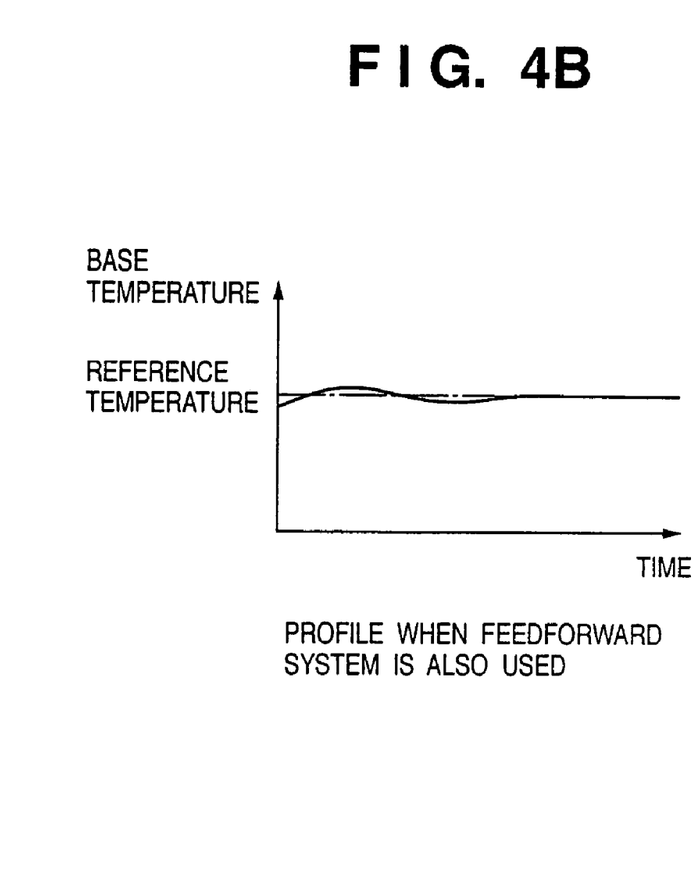
FIG. 4B is a graph showing an example of a temperature change when the temperature of the stage base is controlled using both the feedback loop and a feedforward system in accordance with the embodiment.

FIG. 4A is a graph showing an example of a temperature change when the temperature of the stage base is controlled by a feedback loop alone. FIG. 4B is a graph showing an example of a temperature change when the temperature of the stage base is controlled using both the feedback loop and the feedforward system in accordance with the embodiment. The temperature sensor 6 which measures the temperature of the stage base 2 cannot in most cases be arranged near an area (controlled object portion) of the stage base 2, which needs to be temperature-controlled. For this reason, the controlled object portion is spaced apart from the measurement position, so the temperature measurement result has a time lag. As shown in FIG. 4A, if the temperature of the stage base 2 is controlled by the feedback loop alone, the temperature of the controlled object portion of the stage base 2 largely overshoots the reference temperature. This requires a long settling time. As a result, the temperature controller does not follow a variation in temperature of the stage base 2 due to driving of the stage 1. As shown in FIG. 4B, however, if the feedforward system is introduced, the time for settling to the reference temperature can be shortened.

In the above embodiment, the temperature of the stage base 2 is controlled by controlling the flow rate of a refrigerant. Instead, the temperature controller may control the temperature of the refrigerant (this also applies to the following embodiments).

Second Embodiment

Figure 5A:
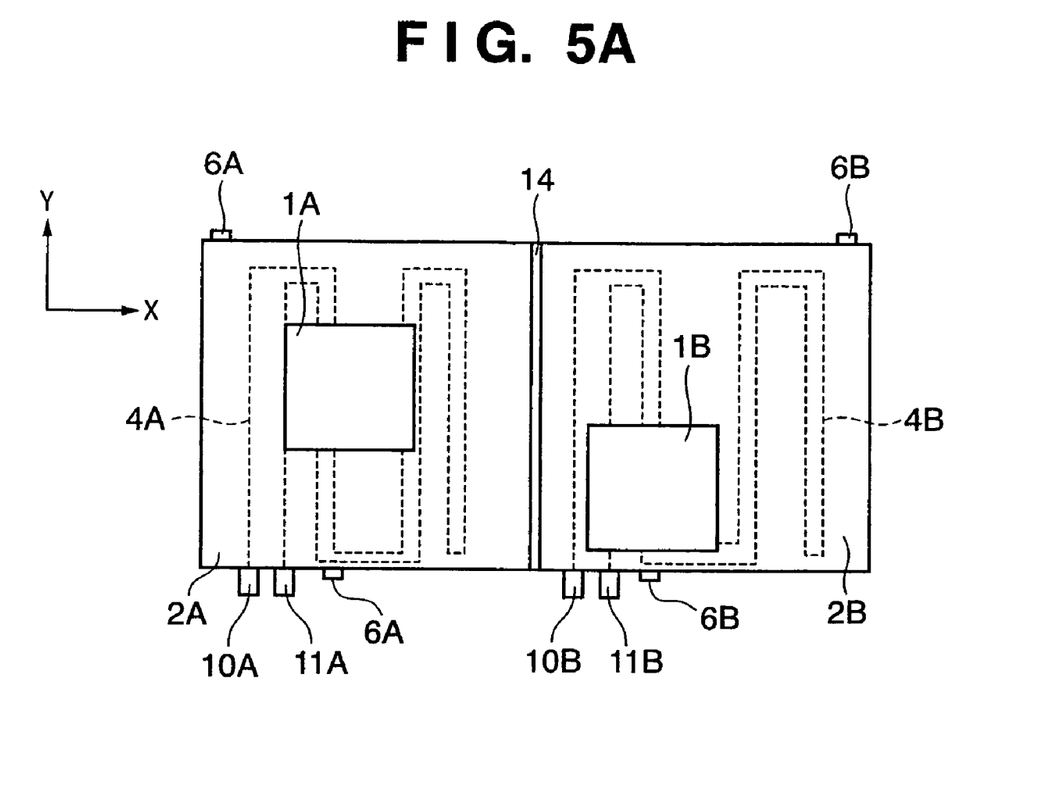
FIGS. 5A and 5B are a plan view and side view, respectively, showing the arrangement of a positioning apparatus according to the second embodiment of the present invention.
Figure 5B:
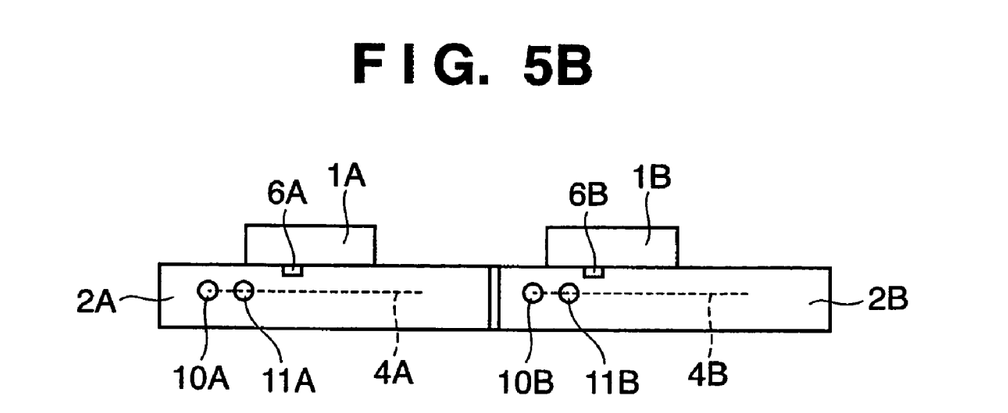

FIGS. 5A and 5B are a plan view and side view, respectively, showing the arrangement of a positioning apparatus according to the second embodiment of the present invention. The positioning apparatus shown in FIG. 2 has twin stages, i.e., two stages 1A and 1B which contribute to improvement of the throughput in an exposure process. More specifically, as alignment measurement is performed using one of the stages, a wafer having undergone the alignment measurement process is exposed using the other stage. When the measurement process and exposure process are completed, the positions of the two stages 1A and 1B are interchanged.

This positioning apparatus two-dimensionally drives the stages 1A and 1B on stage bases 2A and 2B by using, for example, a plane pulse motor. The measurement stage base 2A is arranged in an alignment measurement area. The exposure stage base 2B is arranged in an exposure process area. The two stage bases 2A and 2B are arranged separately from each other. A heat-insulating member 14 is interposed between the two stage bases 2A and 2B to insulate heat transferred between the two stage bases 2A and 2B. The temperatures of two stage bases 2A and 2B are controlled by individual temperature controllers.

As for the measurement stage base 2A, a refrigerant is supplied to a refrigerant path 4A in the measurement area stage base 2A through a refrigerant inlet 10A. As the refrigerant passes through the refrigerant path 4A, it removes heat from the measurement area stage base 2A and is discharged from a refrigerant outlet 11A. A temperature sensor 6A measures the temperature of the measurement stage base 2A. The temperature of the measurement stage base 2A is controlled by a measurement area temperature controller to which the controller shown in FIG. 2 is applied.

As for the exposure stage base 2B, a refrigerant is supplied to a refrigerant path 4B in the exposure area stage base 2B through a refrigerant inlet 10B. As the refrigerant passes through the refrigerant path 4B, it removes heat from the exposure area stage base 2B and is discharged from a refrigerant outlet 11B. A temperature sensor 6B measures the temperature of the exposure area stage base 2B. The temperature of the exposure area stage base 2B is controlled by an exposure area temperature controller to which the controller shown in FIG. 2 is applied.

Assume that the temperature of the measurement stage base 2A is different from that of the exposure stage base 2B. In this case, a measurement error may be caused by an interferometer for positioning (position measurement) of the stages 1A and 1B, or the thermal deformation amount of the stage base 2A may differ from that of the stage base 2B, resulting in a decrease in alignment accuracy (e.g., pattern overlay accuracy).

In general, a stage for an exposure process, i.e., a stage (the stage 1B in FIGS. 5A and 5B, but it is the stage 1A when the stage is interchanged to expose the next wafer) positioned on the exposure stage base 2B has a stage driving profile different from that of a stage for an alignment measurement process, i.e., a stage (the stage 1A in FIGS. 5A and 5B, but it is the stage 1B when the stage is interchanged to measure the next wafer) positioned on the measurement stage base 2A. Hence, the two stage bases 2A and 2B have different heat profiles due to eddy currents generated in them.

In view of this, the above-described measurement area temperature controller and exposure area temperature controller are prepared to feed forward the stage driving profiles of the respective stages, thereby separately controlling the temperatures of the two stage bases 2A and 2B. At this time, when feedback control is executed using the measurement results obtained by the temperature sensors 6A and 6B, it is possible to control the temperatures of the stage bases 2A and 2B with a higher accuracy, thus reducing the temperature difference between the two stage bases 2A and 2B.

Third Embodiment

Figure 6:
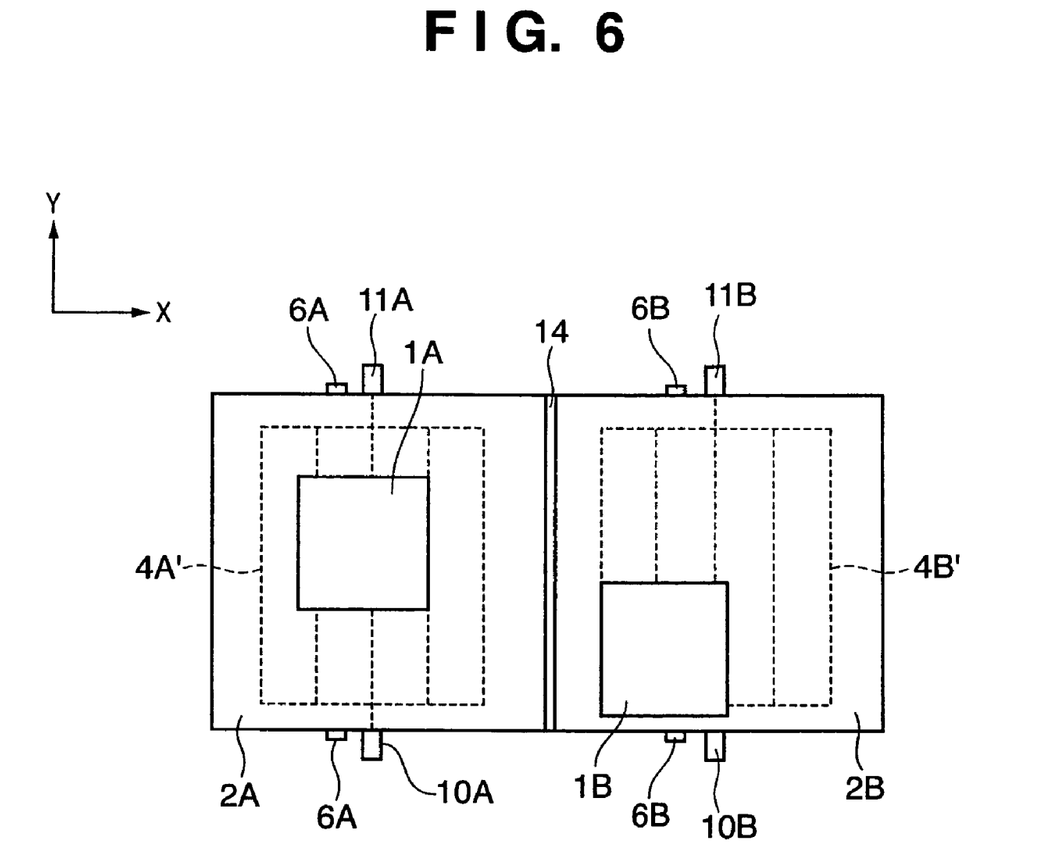
FIG. 6 is a plan view schematically showing the arrangement of a positioning apparatus according to the third embodiment of the present invention.

FIG. 6 is a plan view schematically showing the arrangement of a positioning apparatus according to the third embodiment of the present invention. Note that the same reference numerals as in the second embodiment denote basically the same constituent elements. Refrigerant paths 4A' and 4B' in the third embodiment are different from the refrigerant paths 4A and 4B in the second embodiment. Also, the positions of the refrigerant inlet and refrigerant outlet are changed in correspondence with the above paths. In the second embodiment, each of the refrigerant paths 4A and 4B has one channel meandering in each of the corresponding stage bases 2A and 2B. In the third embodiment, however, each of the refrigerant paths 4A' and 4B' is branched into a plurality of channels in stage bases 2A and 2B and merges thereafter.

The arrangement of a refrigerant path is not limited to the second and third embodiments, and can be appropriately modified to optimize the temperature control effect.

Fourth Embodiment

Figure 7:
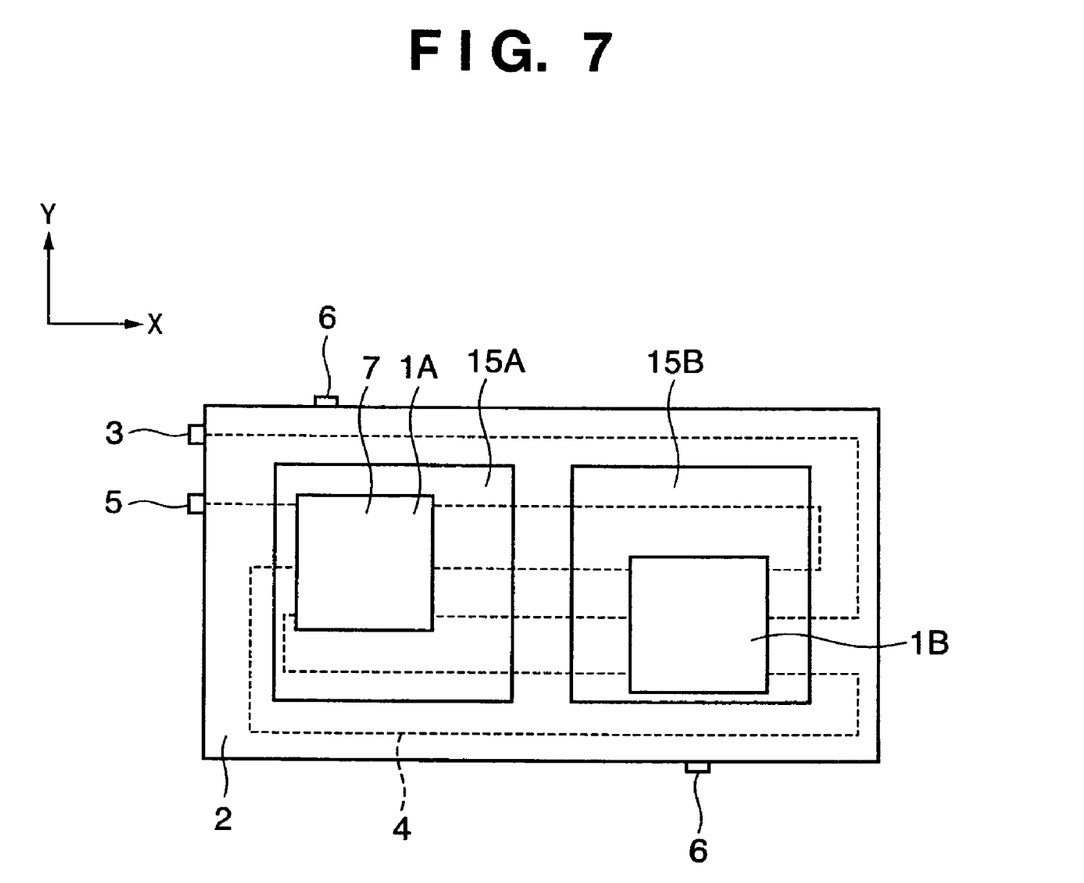
FIG. 7 is a plan view schematically showing the arrangement of a positioning apparatus according to the fourth embodiment of the present invention.

FIG. 7 is a plan view schematically showing the arrangement of a positioning apparatus according to the fourth embodiment of the present invention. Note that the same reference numerals as in the first and second embodiments denote basically the same constituent elements. The positioning apparatus of this embodiment is configured to move two stages 1A and 1B on one stage base 2. Cooling of the stage base 2 can be controlled by the controller shown in FIG. 2. A heater 15A is arranged in a measurement process area, and a heater 15B is arranged in an exposure process area. The heaters 15A and 15B are driven by a heater driver (not shown) so as to set the temperature of a stage (the stage 1A in the state shown in FIG. 7) in the measurement process area equal to that of a stage (the stage 1B in the state shown in FIG. 7) in the exposure process area. The heaters 15A and 15B are also feedforward-controlled or feedforward- and feedback-controlled in accordance with the example of the above-described temperature control.

Fifth Embodiment

Figure 8:
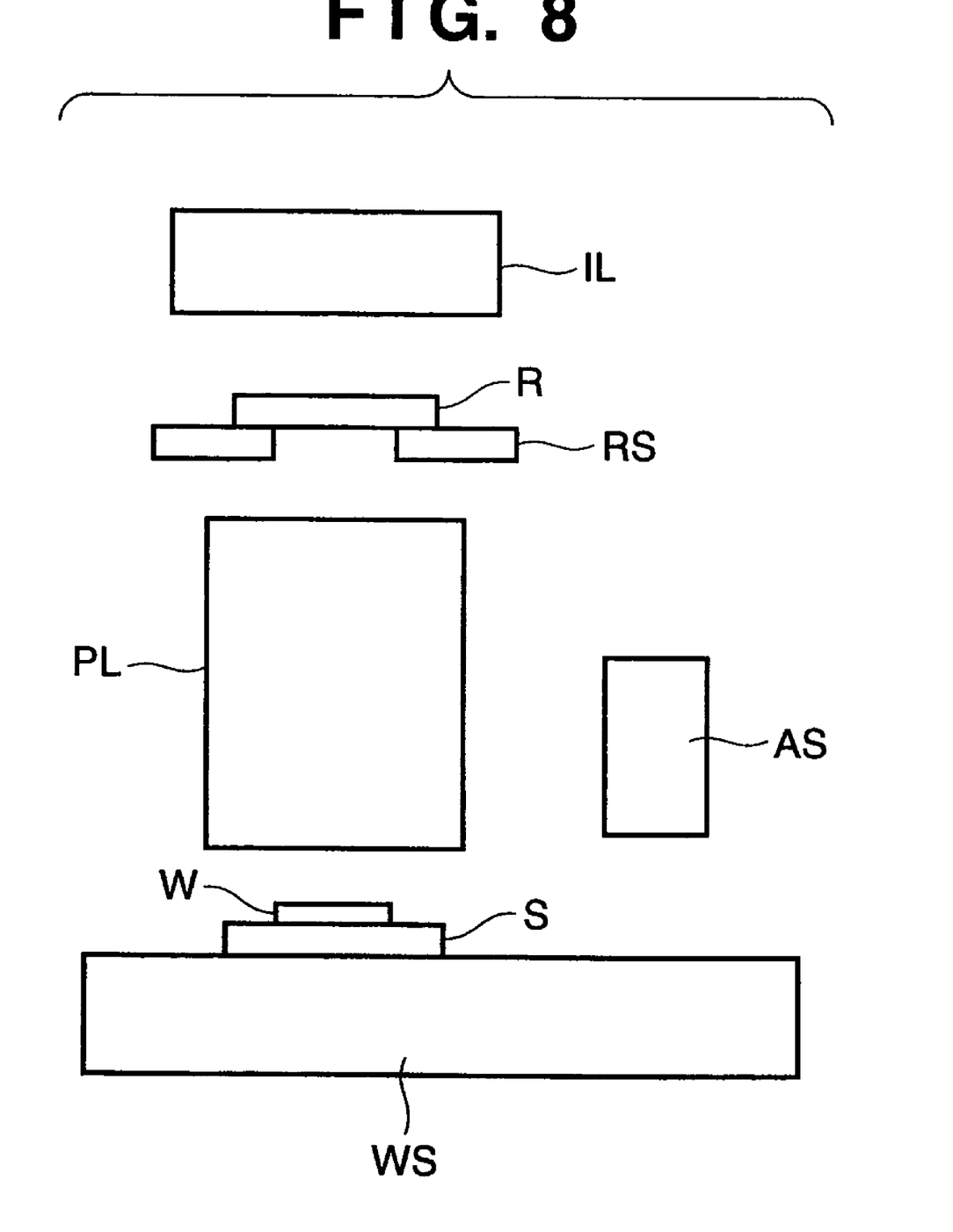
FIG. 8 is a view showing the schematic arrangement of an exposure apparatus which incorporates a positioning apparatus according to the present invention, which is exemplified as the first to fourth embodiments.

FIG. 8 is a view showing the schematic arrangement of an exposure apparatus which incorporates a positioning apparatus according to the present invention, which is exemplified as the first to fourth embodiments. The positioning apparatus according to the present invention may be incorporated as a wafer stage apparatus WS or reticle stage apparatus RS.

An illumination optical system illuminates a reticle (original) R held by the reticle stage RS. The pattern of the reticle R is projected onto a wafer W driven by a stage S of the wafer stage apparatus WS. With this operation, a latent image pattern is formed on a photosensitive agent on the wafer W.

A measurement device AS can execute an alignment measurement process by moving the wafer to an alignment measurement area. When a twin-stage type positioning apparatus (e.g., the second to fourth embodiments) is adopted as the wafer stage apparatus, the alignment measurement process and exposure process can be parallelly performed.

An exposure apparatus which draws a pattern on a photosensitive agent on a wafer by a charged-particle beam such as an electron beam includes one that uses no original and one that uses an original (stencil mask).

Sixth Embodiment

This embodiment provides a device manufacturing method to which an exposure apparatus as in the fifth embodiment according to the present invention is applied. A semiconductor device manufacturing method will be exemplified here.

Figure 9:
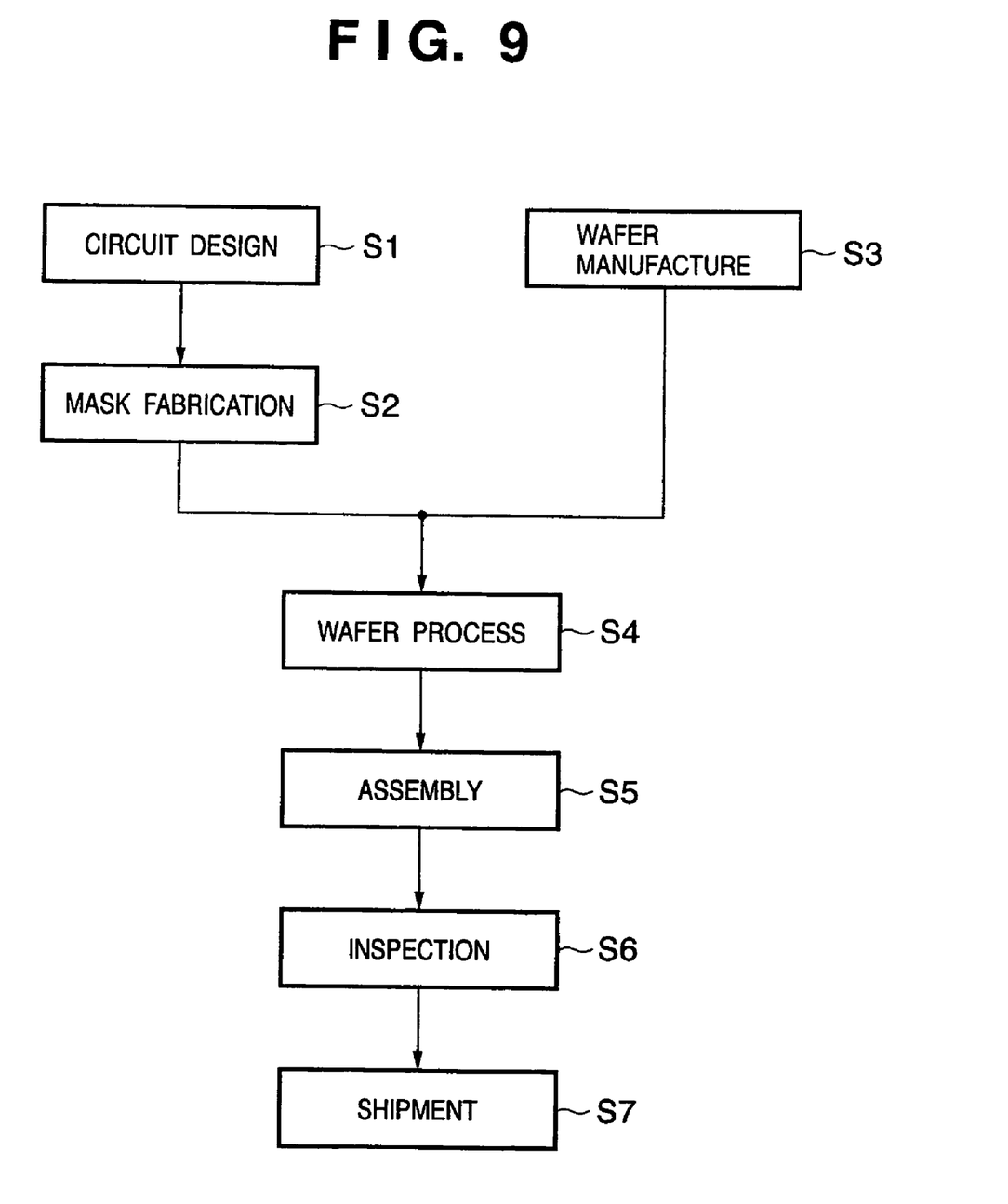
FIG. 9 is a flowchart showing the flow of the overall semiconductor device manufacturing process.

A semiconductor device manufacturing process using the above-described exposure apparatus will be described below. FIG. 9 is a flowchart showing the flow of the overall semiconductor device manufacturing process. In step S1 (circuit design), a semiconductor device circuit is designed. In step S2 (mask fabrication), a mask (also called an original plate or reticle) is fabricated on the basis of the designed circuit pattern. In step S3 (wafer manufacture), a wafer (also called a substrate) is manufactured using a material such as silicon. In step S4 (wafer process) called a pre-process, an actual circuit is formed on the wafer by lithography using the mask and wafer. In step S5 (assembly) called a post-process, a semiconductor chip is formed by using the wafer manufactured in step S4. This step includes an assembly step (dicing and bonding) and packaging step (chip encapsulation). In step S6 (inspection), the semiconductor device manufactured in step S5 undergoes inspections such as an operation confirmation test and durability test. After these steps, the semiconductor device is completed and shipped (step S7).

Figure 10:
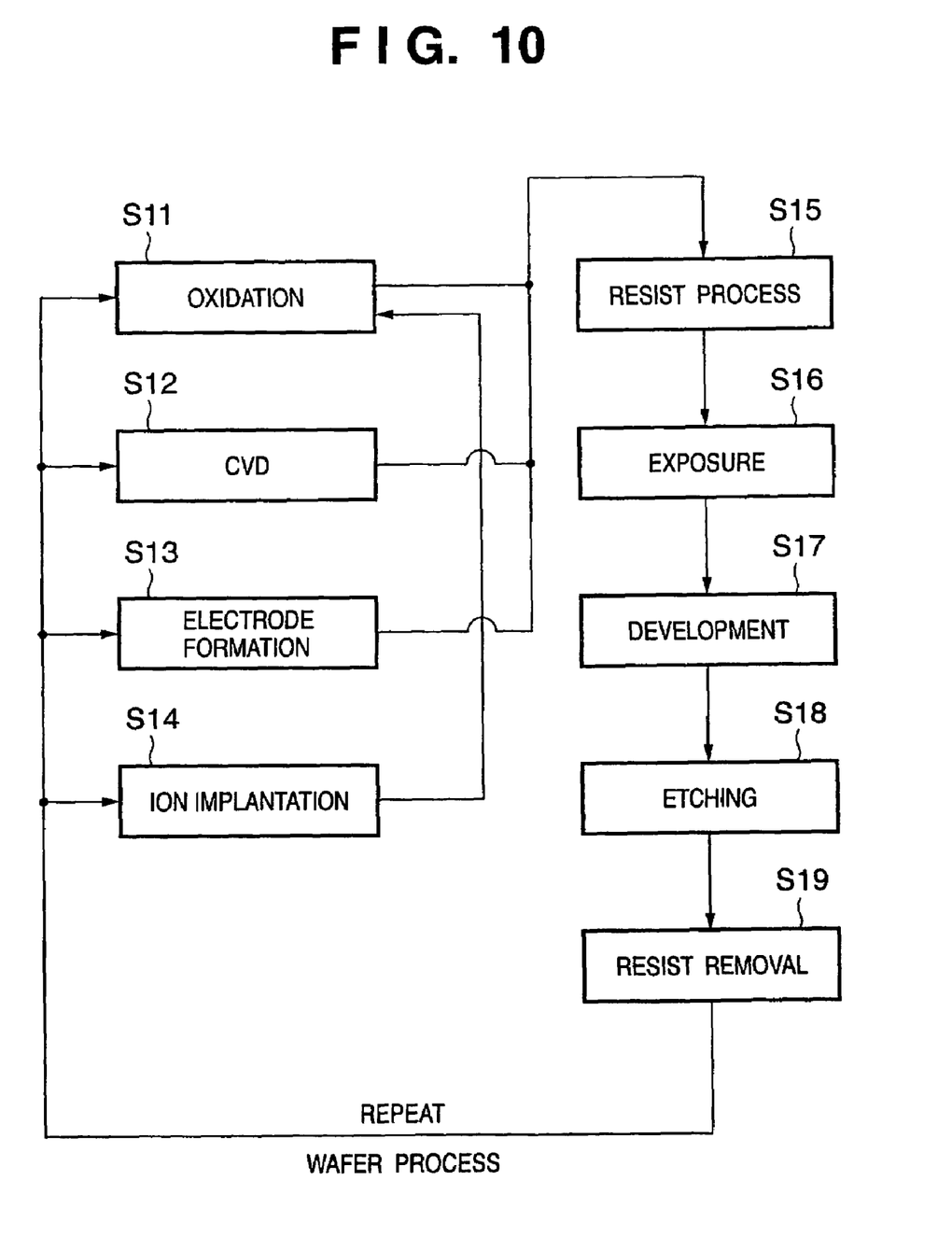
FIG. 10 is a flowchart showing the detailed flow of the wafer process.

FIG. 10 shows the detailed flow of the wafer process. In step S11 (oxidation), the wafer surface is oxidized. In step S12 (CVD), an insulating film is formed on the wafer surface. In step S13 (electrode formation), an electrode is formed on the wafer by vapor deposition. In step S14 (ion implantation), ions are implanted in the wafer. In step S15 (resist process), a photosensitive agent is applied to the wafer. In step S16 (exposure), the exposure apparatus according to the present invention is caused to expose the wafer on which the resist is coated to radiation via the mask on which the circuit pattern is formed to form a latent image pattern. In step S17 (development), the latent image pattern formed on the wafer coated with the photosensitive agent is developed. In step S18 (etching), portions other than the developed resist image are etched. In step S19 (resist removal), any unnecessary resist remaining after etching is removed. These steps are repeated to form multiple circuit patterns on the wafer.

As many apparently widely different embodiments of the present invention can be made without departing from the spirit and scope thereof, it is to be understood that the invention is not limited to the specific embodiments thereof except as defined in the appended claims.

This application claims the benefit of Japanese Patent Application No. 2005-080584 filed on Mar. 18, 2005 and Japanese Patent Application No. 2006-072175 filed on Mar. 16, 2006, which are hereby incorporated by reference herein in its entirety.

What is claimed is:

1. An exposure apparatus for exposing a substrate to radiation, said apparatus comprising:
   a base member having a measurement area for measuring the substrate and an exposure area for exposing the substrate;
   two movable members each configured to hold the substrate and to move on said base member;
   a first temperature adjusting mechanism configured to adjust temperature of the measurement area; and
   a second temperature adjusting mechanism configured to adjust temperature of the exposure area,
   wherein said first temperature adjusting mechanism and said second temperature adjusting mechanism are controlled so as to reduce a temperature difference between the measurement area and the exposure area.

2. An apparatus according to claim 1, wherein:
   a first movable body in the measurement area is driven based on a first driving profile;
   a second movable body in the exposure area is driven based on a second driving profile;
   said first temperature adjusting mechanism is controlled based on the first driving profile, and
   said second temperature adjusting mechanism is controlled based on the second driving profile.

3. An apparatus according to claim 2, wherein the first driving profile represents a change, which depends on lapse of time, in a driving velocity of the first movable body in the measurement area, and the second driving profile represents a change, which depends on lapse of time, in a driving velocity of the second movable body in the exposure area.

4. An exposure apparatus for exposing a substrate to radiation via an original plate, said apparatus comprising:
a base;
an original plate stage configured to hold the original plate and to move on said base;
a temperature adjusting mechanism configured to adjust temperature of said base;
a profiler configured to provide a driving profile for said original plate stage, the driving profile representing a change, which depends on lapse of time, in a driving velocity of said original plate stage;
a controller configured to control said temperature adjusting mechanism based on the driving profile;
a base member having a measurement area for measuring the substrate and an exposure area for exposing the substrate;
two substrate stages each configured to hold the substrate and to move on said base member;
a first temperature adjusting mechanism configured to adjust temperature of the measurement area; and
a second temperature adjusting mechanism configured to adjust temperature of the exposure area;
wherein said first temperature adjusting mechanism and said second temperature adjusting mechanism are controlled so as to reduce a temperature difference between the measurement area and the exposure area.

5. A method of manufacturing a device, said method comprising steps of:
exposing a substrate to radiation using an exposure apparatus;
developing the exposed substrate; and
processing the developed substrate to manufacture the device,
wherein the exposure apparatus is configured to exposure the substrate to radiation and comprise:
a base member having a measurement area for measuring the substrate and an exposure area for exposing the substrate;
two movable members each configured to hold the substrate and to move on the base member;
a first temperature adjusting mechanism configured to adjust temperature of the measurement area; and
a second temperature adjusting mechanism configured to adjust temperature of the exposure area,
wherein said first temperature adjusting mechanism and said second temperature adjusting mechanism are controlled so as to reduce a temperature difference between the measurement area and the exposure area.

6. A method of manufacturing a device, said method comprising steps of:
exposing a substrate to radiation via an original plate using an exposure apparatus;
developing the exposed substrate; and
processing the developed substrate to manufacture the device,
wherein the exposure apparatus is configured to exposure the substrate to radiation via the original plate and comprise:
a base;
an original plate stage configured to hold the original plate and to move on the base;
a temperature adjusting mechanism configured to adjust temperature of the base;
a profiler configured to provide a driving profile for the original plate stage, the driving profile representing a change, which depends on lapse of time, in a driving velocity of the original plate stage;
a controller configured to control the temperature adjusting mechanism based on the driving profile;
a base member having a measurement area for measuring the substrate and an exposure area for exposing the substrate;
two substrate stages each configured to hold the substrate and to move on the base member;
a first temperature adjusting mechanism configured to adjust temperature of the measurement area; and
a second temperature adjusting mechanism configured to adjust temperature of the exposure area,
wherein the first temperature adjusting mechanism and the second temperature adjusting mechanism are controlled so as to reduce a temperature difference between the measurement area and the exposure area.

* * * * *

UNITED STATES PATENT AND TRADEMARK OFFICE
CERTIFICATE OF CORRECTION

PATENT NO. : 7,312,848 B2
APPLICATION NO. : 11/378511
DATED : December 25, 2007
INVENTOR(S) : Hideo Tanaka et al.

It is certified that error appears in the above-identified patent and that said Letters Patent is hereby corrected as shown below:

Column 3, line 62, delete "with vet another" and insert -- with yet another --

Signed and Sealed this

Ninth Day of December, 2008

JON W. DUDAS
*Director of the United States Patent and Trademark Office*